(12) United States Patent
Spina (10) Patent No.: US 12,176,872 B2
(45) Date of Patent: Dec. 24, 2024

(54) CURRENT SENSING CIRCUIT USING TEMPERATURE SELF-COMPENSATED TRANS-RESISTANCE AMPLIFIER

(71) Applicant: STMicroelectronics S.r.l., Agrate Brianza (IT)

(72) Inventor: Antonio Spina, Santa Venerina (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 783 days.

(21) Appl. No.: 17/361,830

(22) Filed: Jun. 29, 2021

(65) Prior Publication Data

US 2022/0416740 A1 Dec. 29, 2022

(51) Int. Cl.
*H03F 3/45* (2006.01)
*H03F 3/387* (2006.01)

(52) U.S. Cl.
CPC ......... *H03F 3/45475* (2013.01); *H03F 3/387* (2013.01); *H03F 2200/462* (2013.01)

(58) Field of Classification Search
CPC ................. H03F 3/45475; H03F 3/387; H03F 2200/462; H03F 2200/261; H03F 2203/45514; G01R 19/32; G01R 1/30
USPC ............................................................ 330/9
See application file for complete search history.

(56) References Cited

U.S. PATENT DOCUMENTS

| 2014/0340150 A1* | 11/2014 | Dempsey | H03F 3/45475 330/260 |
| 2015/0280660 A1* | 10/2015 | Azin | H03F 3/45183 330/260 |
| 2023/0172514 A1* | 6/2023 | Verstreken | A61B 5/311 330/9 |

* cited by examiner

*Primary Examiner* — Andrea Lindgren Baltzell
*Assistant Examiner* — Jose E Pinero
(74) *Attorney, Agent, or Firm* — Crowe & Dunlevy LLC (57) ABSTRACT

A current sensor architecture is implemented using a transresistance amplifier circuit having a low pass filter characteristic. The current sensing resistor and the input resistors for the amplifier circuit are matched thermally so that they have substantially identical temperature coefficients. The feedback resistors, which are coupled in parallel with corresponding capacitors, are implemented using switched capacitor circuits that emulate resistors. With this configuration, the current sensor is temperature insensitive.

35 Claims, 6 Drawing Sheets

CURRENT SENSING CIRCUIT USING TEMPERATURE SELF-COMPENSATED TRANS-RESISTANCE AMPLIFIER

TECHNICAL FIELD

Embodiments relate to current sensing circuits and, in particular, to addressing concerns with inaccuracy in current sense measurement due to temperature variation.

BACKGROUND

Figure 1:
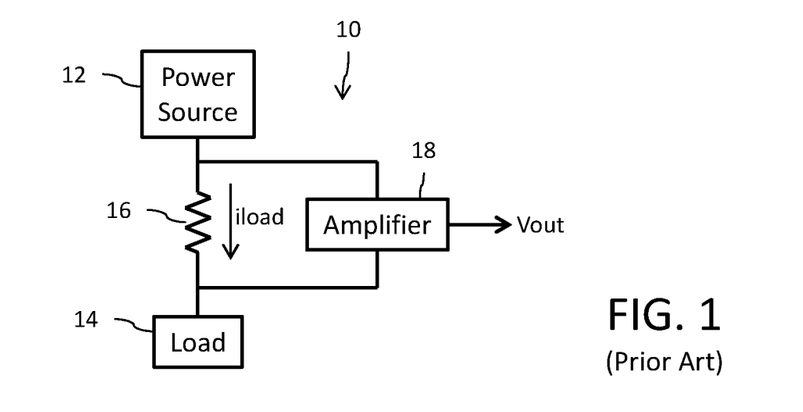
FIG. 1 shows a circuit diagram of a conventional current sensing circuit.

Reference is made to FIG. 1 which shows a circuit diagram of a conventional current sensing circuit 10. A power source 12 supplies a current iload to a load 14. In many applications it is important to be able to sense the magnitude of the current iload. The current sensing circuit 10 functions to sense the current iload using a sense resistor 16 connected in series with the load 14 so that the current iload passes through the sense resistor 16. A differential amplifier 18 has input terminals connected on opposite ends of the sense resistor 16 and functions to measure the voltage drop across the sense resistor 16 in response to the applied current iload. The differential amplifier 18 applies a gain to the measured voltage drop to generate an output voltage Vout which is proportional to the current iload:

$$Vout = Rsense \cdot iload \cdot G$$

where: Rsense is the resistance of the sense resistor 16 and G is the gain of the differential amplifier 18. Because the gain G of the differential amplifier 18 is typically very accurate (for example, fixed by a ratio of a feedback resistor and an input resistor of the amplifier circuit), inaccuracy of the current measurement typically arises from a non-negligible variation in the very small resistance Rsense as a function of temperature, process and package stress.

A known solution to the concern with inaccuracy in the current sensing measurement is to utilize digital signal processing techniques where the voltages at the opposite ends of the sense resistor 16 are converted to digital signals and the voltage difference is determined in the digital domain. With respect to addressing temperature variation, the digitized measurements of the voltages at the opposite ends of the sense resistor 16 can be adjusted by moving the analog-to-digital conversion reference voltage as a function of temperature. Alternatively, if a microprocessor is available, a digital correction based on temperature can be applied to the digital voltage values. There are a number of drawbacks with these digital signal processing solutions including: the requirement of additional circuits with a consequent increase in circuit complexity, occupied circuit area and power consumption; a need for accurate circuit trimming; and a need for circuit testing and calibration operations.

In many circuit applications, it is not feasible to include digital circuitry, and thus there is a need in the art for an analog circuit solution to address inaccuracy of the current measurement versus process and temperature variation of the sense resistor.

SUMMARY

In an embodiment, a circuit comprises: a differential input comprising a first input node and a second input node; a fully differential amplifier circuit comprising a first amplifier input node, a second amplifier input node, a first amplifier output node and a second amplifier output node; a first input resistor coupled between the first input node and the first amplifier input node; a second input resistor coupled between the second input node and the second amplifier input node; a first feedback resistor coupled between the first amplifier output node and the first amplifier input node; and a second feedback resistor coupled between the second amplifier output node and the second amplifier input node. Each of the first and second feedback resistors is implemented as a switched capacitor circuit which emulates a resistor.

In an embodiment, a circuit comprises: a first input node; a second input node; a first output node; a second output node; a current sensing resistor connected between the first and second input nodes and through which a current to be sensed flows; a first input resistor connected between the first input node and a first intermediate node; a second input resistor connected between the second input node and a second intermediate node; a fully differential amplifier circuit comprising a first amplifier input node coupled to the first intermediate node, a second amplifier input node coupled to the second intermediate node, a first amplifier output node coupled to the first output node and a second amplifier output node coupled to the second output node; a first feedback resistor connected between the first output node and the first intermediate node; and a second feedback resistor connected between the second output node and the second intermediate node. Each of the first and second feedback resistors is implemented as a switched capacitor circuit which emulates a resistor.

In an embodiment, a circuit comprises: a first input node; a second input node; an output node; a current sensing resistor connected between the first and second input nodes and through which a current to be sensed flows; a first input resistor connected between the first input node and a first intermediate node; a second input resistor connected between the second input node and a second intermediate node; a differential amplifier circuit comprising a first amplifier input node coupled to the first intermediate node, a second amplifier input node coupled to the second intermediate node, and an amplifier output node coupled to the first output node; a first sensing resistor connected between the first amplifier input node and a reference node; and a second sensing resistor connected between the second amplifier input node and the reference node. Each of the first and second sensing resistors is implemented as a switched capacitor circuit which emulates a resistor.

BRIEF DESCRIPTION OF THE DRAWINGS

For a better understanding of the embodiments, reference will now be made by way of example only to the accompanying figures in which:

FIG. 5B is a graph plotting resistance as a function of temperature for amplifier input resistors;

where the sense and input resistors have a same length, are placed in a same area, and are of a same type (for example, implemented in n+ polysilicon);

DETAILED DESCRIPTION OF THE DRAWINGS

Figure 2:
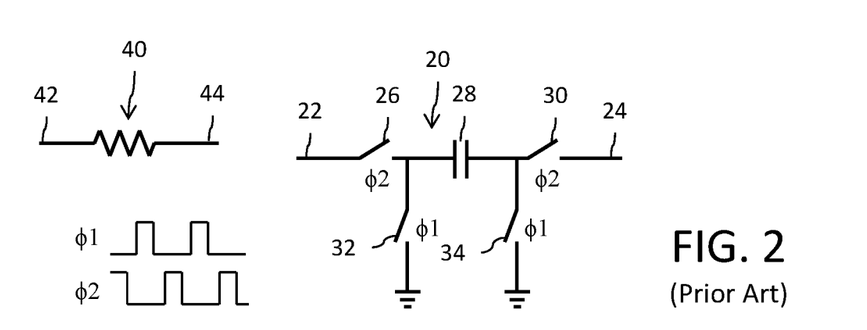
FIG. 2 is a circuit diagram for a switched capacitor circuit that emulates a resistor.

It is known in the art to emulate a resistor using a switched capacitor technique. FIG. 2 shows a circuit diagram for a switched capacitor circuit 20 that emulates a resistor 40. The switched capacitor circuit 20 includes a first terminal 22 (which corresponds to the first terminal 42 of the emulated resistor) and a second terminal 24 (which corresponds to the second terminal 44 of the emulated resistor). A first terminal of a capacitor 28 is selectively connected to the first terminal 22 by a first switch 26. The first terminal of the capacitor 28 is further selectively connected to a reference node (for example, ground) by a second switch 32. A second terminal of the capacitor 28 is selectively connected to the second terminal 24 by a third switch 30. The second terminal of the capacitor 28 is further selectively connected to the reference node (for example, ground) by a fourth switch 34. The switching operations of the second and fourth switches 32 and 34 are controlled by a first clock signal ϕ1. The switching operations of the first and third switches 26 and 30 are controlled by a second clock signal ϕ2. The first and second clock signals ϕ1 and ϕ2 are non-overlapping clocks as shown.

The switched capacitor circuit 20 is essentially a discrete time resistor. The current isc flowing in the capacitor 28 of the switched capacitor circuit 20 is given by:

$$isc = \frac{q}{T} = \frac{C}{T}(Va - Vb)$$

where: T is the period of the clock signals; q is charge transferred to the capacitor 28 during the period T; C is the capacitance of the capacitor 28; Va is the voltage at the first terminal 22; and Vb is the voltage at the second terminal 24. Thus, the equivalent resistance Req of the switched capacitor circuit 20 is:

$$Req = \frac{T}{C}$$

Figure 3:
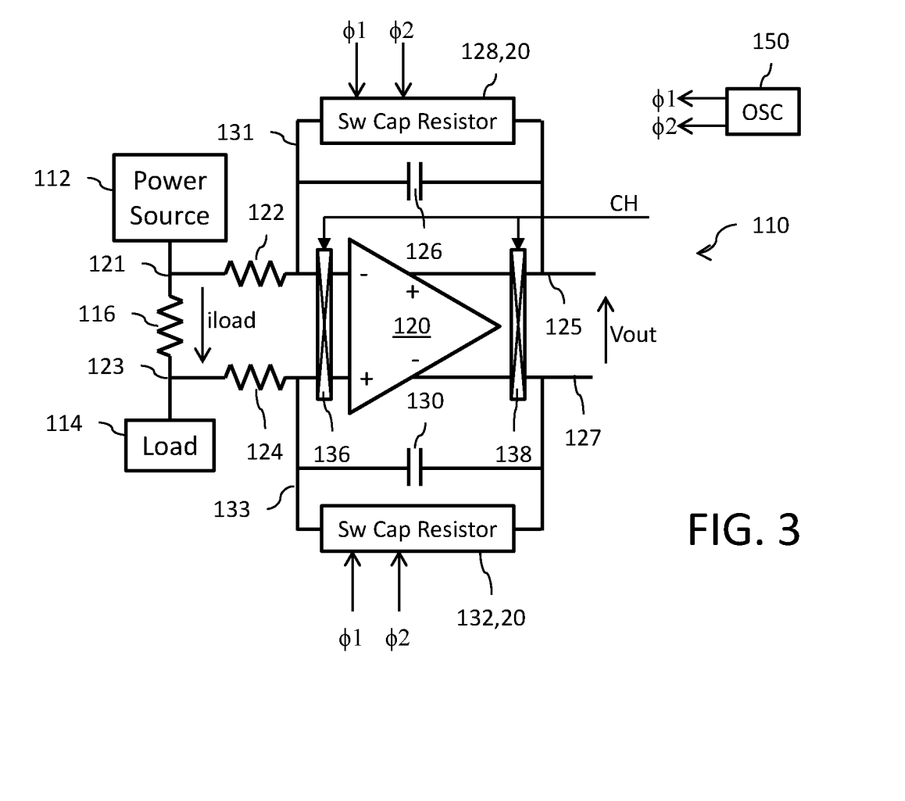
FIG. 3 shows a circuit diagram of a current sensing circuit.

Reference is now made to FIG. 3 which shows a circuit diagram of a current sensing circuit 110. A power source 112 supplies a current iload to a load 114. The current sensing circuit 110 is configured as an active (for example, first order) low pass filter circuit stage that functions to sense the current iload using a sense resistor 116 connected in series with the load 114 (where the current iload passes through the sense resistor 116). The low pass filter circuit utilizes a fully-differential amplifier circuit 120 (for example, implemented using an operational amplifier) having a first (for example, inverting (−)) input coupled through intermediate node 131 and an input resistor 122 to a first end of the sense resistor 116 (at a first differential input node 121) and a second (for example, non-inverting (+)) input coupled through intermediate node 133 and an input resistor 124 to a second end of the sense resistor 116 (at a second differential input node 123). A first (for example, non-inverting (+)) output of the differential amplifier circuit 120 (at a first differential output node 125) is coupled to the first input of the differential amplifier circuit 120 through intermediate node 131 by a feedback circuit comprising a parallel connection of a feedback capacitor 126 and a switched capacitor circuit 128 which emulates a feedback resistor (where the switched capacitor circuit 128 may be implemented as shown by circuit 20 in FIG. 2). A second (for example, inverting (−)) output of the differential amplifier circuit 120 (at a second differential output node 127) is coupled to the second input of the differential amplifier circuit 120 through intermediate node 133 by a feedback circuit comprising a parallel connection of a feedback capacitor 130 and a switched capacitor circuit 132 which emulates a feedback resistor (where the switched capacitor circuit 130 may be implemented as shown by circuit 20 in FIG. 2).

Advantageously, the capacitance C of each switched capacitor circuit 128 and 132 can be relatively small in support of the implementation of a low cutoff frequency for the low pass filter function. Such a small capacitance permits integration of the capacitors with a small circuit area.

A first chopping circuit 136 is provided at the differential input of the differential amplifier circuit 120 (between intermediate nodes 131 and 133 and the first and second differential amplifier inputs), and a second chopping circuit 138 is provided at the differential output of the differential amplifier circuit 120 (between the first and second differential amplifier outputs and the first and second differential output nodes 125 and 127). The chopping operation performed by the first and second chopping circuits 136 and 138 is controlled by a chop control signal CH, and the first and second chopping circuits 136 and 138 function to remove the offset introduced by the differential amplifier circuit 120.

As previously noted, inaccuracy of the current measurement arises from a non-negligible variation in the very small resistance Rsense of the sense resistor 116 as a function of temperature, process and package stress. To better understand how the current sensing circuit 110 compensates for temperature variation, consider the following analysis of the gain between the differential output voltage Vout and the input current as a function of temperature for a conventional current sensing circuit 10 like that shown in FIG. 1:

$$Vout(T) = Rsense(1 + \alpha(T - Tref))G \cdot iload$$

$$Vout(T) = Rsense(1 + \alpha(T - Tref))\frac{Rfb(1 + \beta(T - Tref))}{Rin(1 + \beta(T - Tref))}iload$$

where: Rsense is the resistance of the sense resistor 16; α is the first order temperature coefficient of the sense resistor 16; T is ambient temperature; Tref is a reference temperature; G is the gain of the low pass filter circuit implemented using the differential amplifier 18; Rfb is the resistance of the feedback resistor for the amplifier circuit 18; Rin is the resistance of the input resistor for the amplifier circuit 18; and β is the first order temperature coefficient of the input and feedback resistors. For simplicity purposes, only the first order temperature coefficients are considered here. The foregoing equations show that temperature does not affect the DC gain G of the active low pass filter circuit because the gain G is fixed by the ratio of two resistors Rfb and Rin having the same temperature coefficient (β). However, temperature does have an effect on the differential output voltage Vout due to the temperature coefficient (α) of the sense resistor 16.

The active low pass filter circuit implemented using the differential amplifier circuit in FIG. 3 effectively operates to make the gain G independent of temperature. The switched capacitor resistors 128 and 132 in the feedback circuit are substitutes for the conventional passive feedback resistors (like those used in the circuit of FIG. 1) in order to make it possible to compensate for temperature variation of the sense resistor 116.

The switched capacitor resistors 128 and 132 have an equivalent resistance Req of:

$$Req = \frac{Tck}{C}$$

where: Tck is the clock period of non-overlapping first and second clock signals φ1 and φ2; and C is the capacitance of the capacitor 28. Substituting this equivalent resistance Req for the feedback resistance Rfb in the equation above for the differential output voltage Vout yields:

$$Vout(T) = Rsense(1 + \alpha(T - Tref))\frac{Tck/C}{Rin(1 + \beta(T - Tref))}iload$$

So, if the sense resistor 116 (with resistance Rsense) and the input resistor 122, 124 (with resistance Rin) can be matched thermally (for example, placed very close to each other and made of the same type—such as N+ polysilicon) so that their (at least, first order) temperature coefficients are equal (i.e., α=β), or substantially equal (for example, within 1-2% of each other), and they have the same process variation and are exposed to the same package stress, then they will compensate each other and the equation for the differential output voltage Vout simplifies to:

$$Vout(T) = Rsense\frac{Tck/C}{Rin}iload$$

and this is independent of temperature variation. It will be noted that this relation will not be affected by exogenous variables.

In this implementation, the output voltage Vout is a function of the clock period Tck for the non-overlapping first and second clock signals φ1 and φ2. Thus, it is critical that an accurate oscillator circuit 150 (for example, a quartz oscillator) be used to generate the first and second clock signals φ1 and φ2. This is typically not a concern as many circuits will have a need for an accurate clock on chip, or such a clock can be easily provided from a clocking circuit external to the integrated circuit.

It will be noted that the time constant τ for the low pass filter is given by:

$$\tau = \frac{Tck}{C}Cfb$$

where: Tck is the clock period of non-overlapping first and second clock signals φ1 and φ2; C is the capacitance of the capacitor 28; and Cfb is the capacitance of the feedback capacitor 126, 130. The time constant τ is thus process insensitive and its value is fixed by the capacitor ratio, so as to lead to a very precise cutoff frequency for the low pass filter.

Additionally, this circuit configuration allows for the use of a large resistance that is useful in setting a high DC gain.

Figure 4:
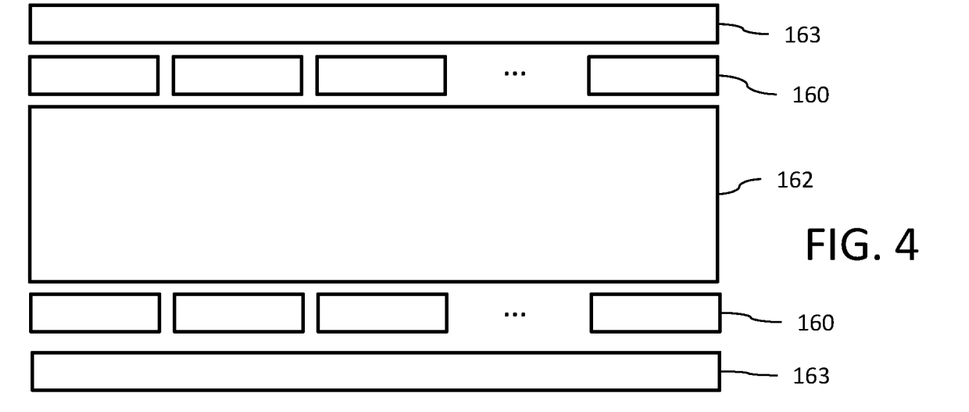
FIG. 4 shows an example layout configuration for integrated circuit implementation of temperature coefficient matched resistors.
Figure 5A:
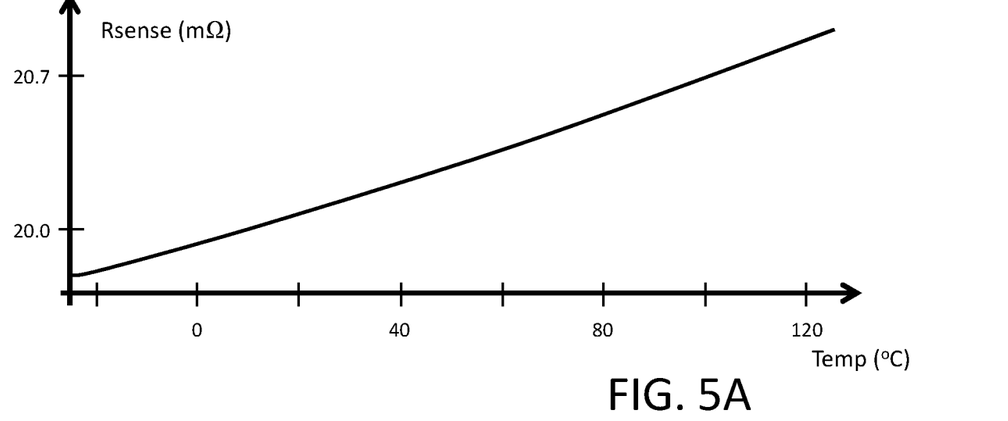
FIG. 5A is a graph plotting resistance as a function of temperature for a sense resistor.
Figure 5B:
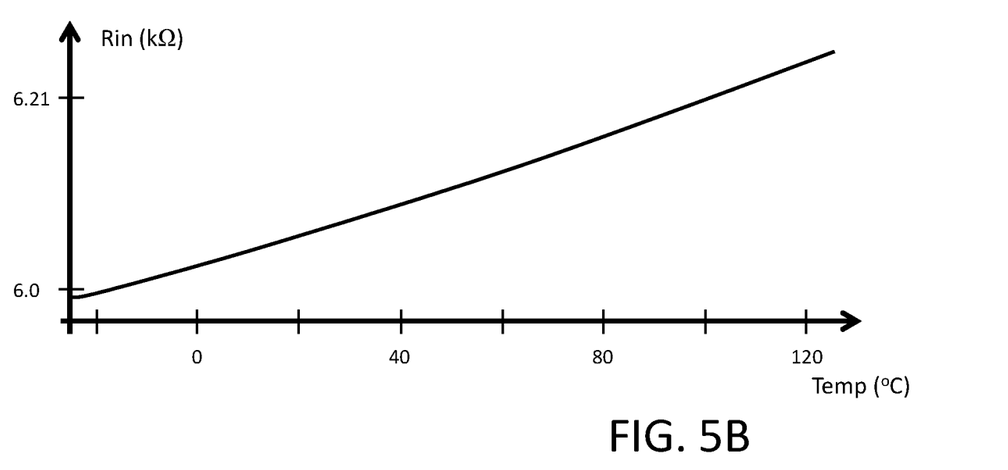

To achieve a matching of the sense resistor 116 (having resistance Rsense) and the input resistor 122, 124 (having resistance Rin), these resistors may be implemented in integrated circuit technology as polysilicon resistors having a substantially same (plus or minus a few percent) length, or more preferably identical lengths (within the applicable manufacturing tolerances). The following considerations are taken into account in the design and layout strategy for the resistors 116, 122, 124. First, all resistors are implemented using heavily n-type doped (N+) polysilicon (with a same doping concentration) without salicidation. Generally, the N+ polysilicon resistor has a sheet resistance lower than the P+ polysilicon resistor so that a lower area is needed for implementation of the resistor 116. It will be noted, however, that use of P+ polysilicon resistor is certainly an option. Second, the all resistors are implemented to have a substantially same length, and more preferably identical length, and module orientation (i.e., the resistors have widths and lengths which extend in the same directions). The sense resistor 116 may, for example, have a total resistance (Rsense) of about 20 mΩ where the resistor is formed by a plurality of modules that are connected in parallel and wherein each module has a width (for example, of 530 μm) and a length (for example, of 2 μm). In an embodiment, the width of the sense resistor 116 is about two orders of magnitude larger than the length of the sense resistor. The input resistor 122, 124 may, for example, have a total resistance of 6 kΩ where the resistor is formed by a plurality of modules that are connected in series and wherein each module has a width (for example, of 6 μm) and a length (for example, of 2 μm). In an embodiment, the width of the input resistor 122 is about a same order of magnitude as the length of the input resistor and the length of the sense resistor. FIG. 4 shows an example layout where the modules for the input resistors 122, 124 are arranged in areas 160 positioned above and below an area 162 for the modules of the sense resistor 116. This layout strategy ensures that the sense resistor 116 and the input resistor 122, 124 are located in an area exposed to a uniform temperature. Moreover, a dummy module of the sense resistor 116 is placed in areas 163 in order to improve matching. The area 160 for the input resistors 122, 124 is accordingly located between area 162 and the corresponding area 163. FIGS. 5A and 5B show graphs plotting resistance as a function of temperature for the sense resistor 116 and the input resistor 122, 124, respectively, which are implemented using same lengths and with the layout as shown in FIG. 4. It will be noted that FIGS. 5A and 5B show the two resistors with very different resistance values but having substantially equal temperature coefficients.

Figure 6:
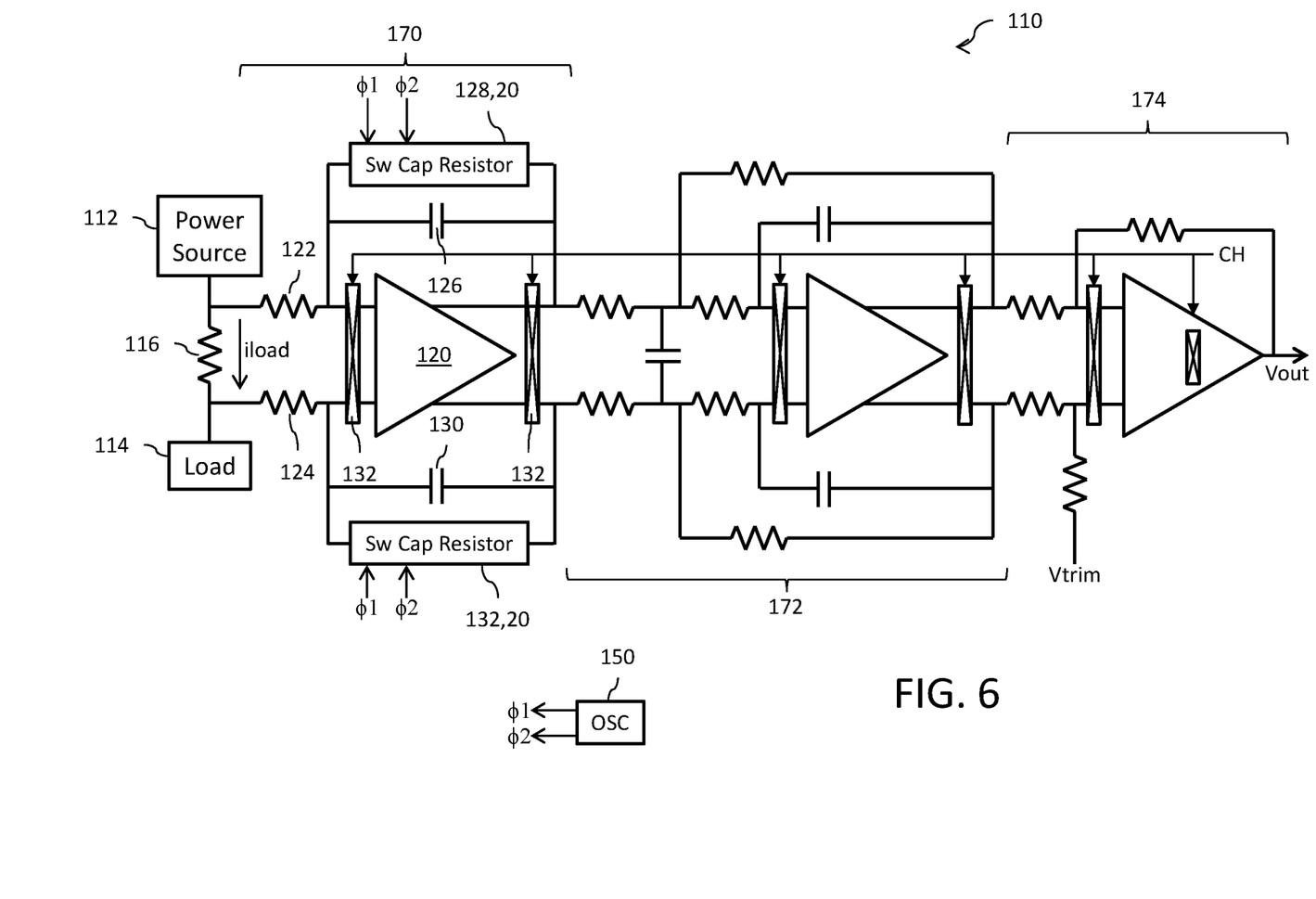
FIG. 6 is a circuit diagram of another embodiment of the current sensing circuit.

FIG. 6 is a circuit diagram of another embodiment of the current sensing circuit 110. In the embodiment of FIG. 6, the active low pass filter circuit is implemented as a third order low pass filter using a first order low pass filter stage 170 (corresponding to the circuit stage as shown in FIG. 3) in cascade with a second order low pass filter stage 172. The use of a third order filter response is desirable to address operating scenarios where there is a large ripple in the current sunk by the load 12 (for example, in a DC-DC converter operation). A split of the low pass filter circuit into two circuit stages is preferred in order to support the use in the first stage 170 of a low capacitance value for the higher voltage capacitors 126 and 130 (because in the case of high common mode input voltage, the capacitors have to be a high voltage class—i.e., higher area consumption), a high gain with a large resistance resistor (easy to have with the use of the switched capacitor circuits 128 and 132), and a low mismatch of the passive circuit elements. The second order low pass filter stage 172 in this example is a fully differential Rauch-type filter (well known to those skilled in the art). In order to generate an output voltage on a single output line (which is needed in some applications such as with the case of a current control loop), the current sensing circuit 110 in FIG. 6 further utilizes a fully differential to single ended conversion buffer circuit 174 coupled in cascade with the stage 172. Chopper functionality, controlled by chop control signal CH, is provided for both the second order low pass filter stage 172 and the conversion buffer circuit 174 in order to ensure cancelation of amplifier offset voltage. The conversion buffer circuit 174 may further include an input configured to receive a trimming voltage Vtrim in support of amplifier offset trimming.

As an alternative in cases where load drive capability is not critical, the conversion buffer circuit 174 may be omitted and the second order low pass filter stage 172 can be implemented with a single ended output.

Figure 7:
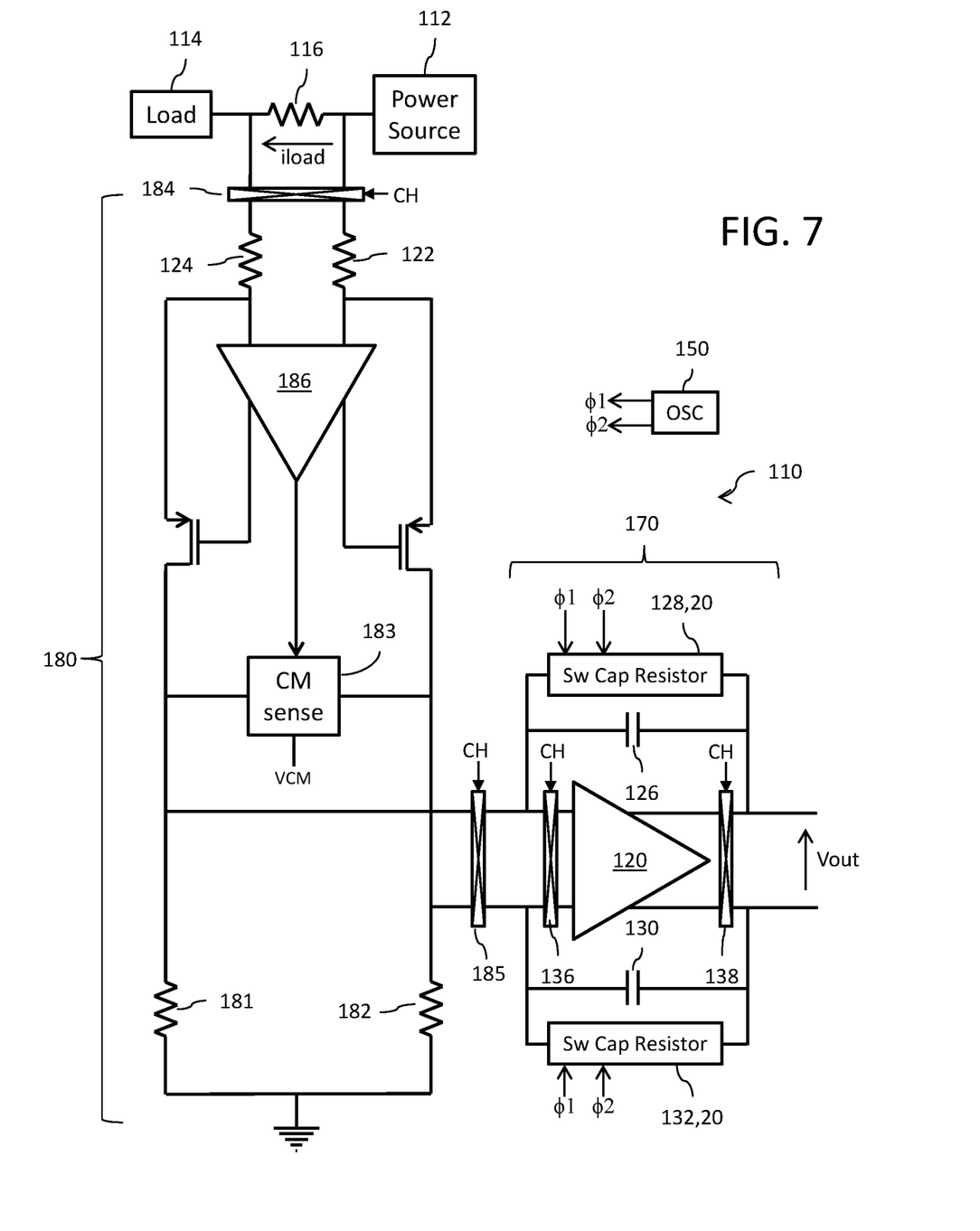
FIG. 7 is a circuit diagram of a further embodiment of the current sensing circuit.

Reference is now made to FIG. 7 which shows a circuit diagram of another embodiment of the current sensing circuit 110. The circuit 110 of FIG. 7 differs from the circuits 110 of FIGS. 3 and 6 in that it includes a voltage to current converter input stage 180 that is configured to convert the voltage drop across the sense resistor 116 to a differential current for input to the second stage low pass filter. This input stage 180, known as high side current sensing circuit, allows for current measurement in case of a high common mode input voltage (generally higher than 5V). Common mode sense block 183 reads the voltage drop on sensing resistors 181 and 182, compares against a common mode voltage VCM, and generates a current to control common mode of the fully differential operational amplifier circuit 186 in order to adjust common mode current to equal VCM/R (where R is the resistance of resistors 181 and 182). Second stage 170 processing implements a fully differential current to voltage conversion operation with low pass filtering to generate the differential output voltage Vout. Further analog signal processing (references 172, 174) as shown in FIG. 6 may be performed if desired. The chopping circuits 184 and 185 are driven by non-overlapping clock CH signals, and are used for dynamic offset compensation of first stage 180. The second stage 170 is offset compensated by means of the chopping circuits 136 and 138. The feedback resistors 128 and 132 of second stage are implemented using a switched capacitor resistor circuit (reference 20, FIG. 2). Finally, the input/output relationship here is the same of as with the previous current sensing circuits 110 so the circuit likewise addresses issues with temperature compensation.

Figure 8:
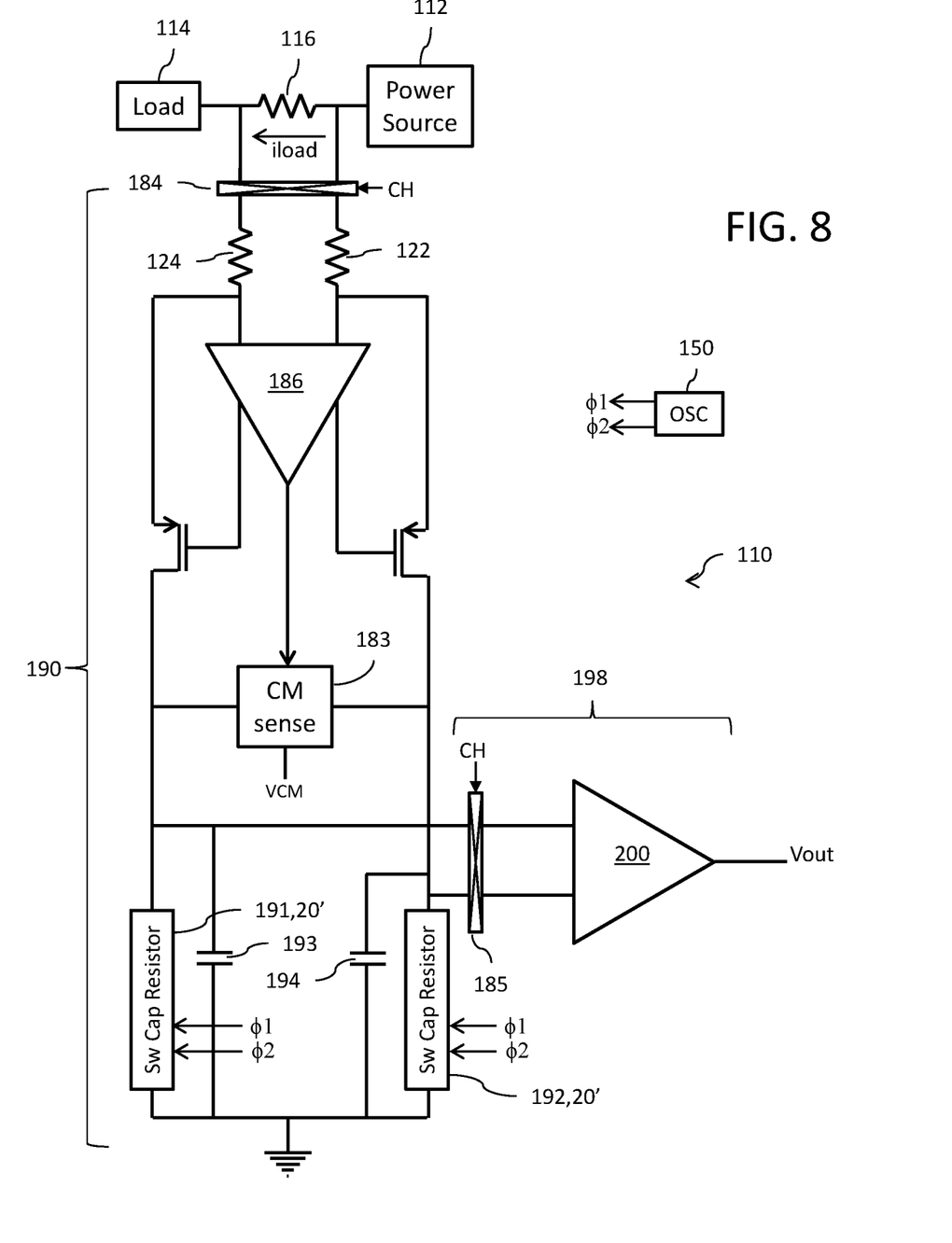
FIG. 8 is a circuit diagram of yet another embodiment of the current sensing circuit.
Figure 9:
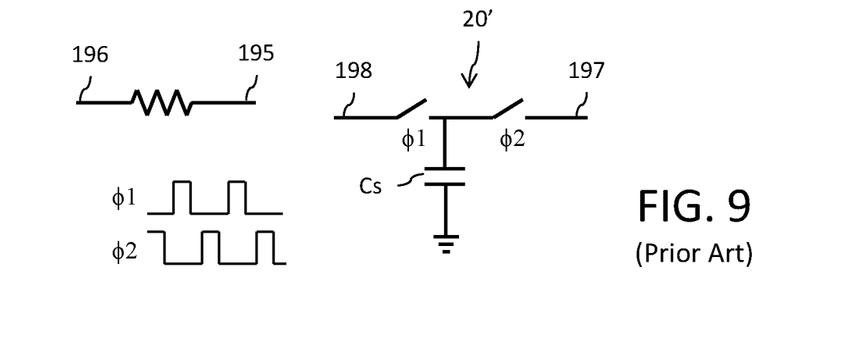
FIG. 9 is a circuit diagram for a switched capacitor circuit that emulates a resistor.

FIG. 8 is a circuit diagram of another embodiment of the current sensing circuit 110. In this implementation, the input stage 190 is similar to the input stage 180. However, in FIG. 8, the sensing resistors 181 and 182 have been replaced by switched capacitor circuits 191 and 192, respectively, implemented using the circuit 20' configuration as shown in FIG. 9 (well known as parallel configuration) where the terminals 197 and 198 correspond to terminals 195, 196 of the corresponding passive resistor and are respectively connected to ground and the input terminals of CM sense block 183. Capacitors 193 and 194 are connected in parallel with switched capacitor circuits 191 and 192, respectively, in order to provide a time constant fixed by the ratio of Tck(Co/Cs) where: Tck is period of the non-overlapping first and second clock signals ϕ1 and ϕ2, Co is capacitance of capacitors 193 and 194, and Cs is capacitance of capacitor used for switched capacitor resistor emulation. Second stage 198 is a voltage buffer circuit 200, with a chopping circuit 185 at the input. This buffer circuit can be implemented in a number of different ways as is well known in the literature.

To summarize, a current sensor architecture takes current as input and provides voltage as output. The implementation is thus as a trans-resistance amplifier with mathematical relation where:

$$Vout = Rsense \frac{Rfb}{Rin} iload$$

in a configuration where:

$Rfb/Rin$ is a voltage gain G. Looking at the last relationship, is easy to understand how each exogenous resistance change (for example, due to temperature, process, etc.) is cancelled only on the factor:

$Rfb/Rin$ because the two resistors are matched and in ratio relationship—for instance, in case of temperature, the effect of Tc is canceled by means of the ratio:

$$\frac{Rfb(1 + \beta(T - Tref))}{Rin(1 + \beta(T - Tref))}$$

Thus, circuit embodiment herein concerns the use of a switched capacitor circuit to emulate the feedback resistor in order to have the new relationship of:

$$Vout = Rsense \frac{Tck/C}{Rin} iload$$

where there appears only one resistor ratio useful for self-compensation of each exogenous resistor variation.

The foregoing description has provided by way of exemplary and non-limiting examples of a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:
1. A circuit, comprising:
a differential input comprising a first input node and a second input node;
a fully differential amplifier circuit comprising a first amplifier input node, a second amplifier input node, a first amplifier output node and a second amplifier output node;
a first input resistor coupled between the first input node and the first amplifier input node;

a second input resistor coupled between the second input node and the second amplifier input node;
a first transistor coupled in series with the first input resistor between the first input node and the first amplifier input node;
a second transistor coupled in series with the second input resistor between the second input node and the second amplifier input node;
a first feedback resistor coupled between the first amplifier output node and the first amplifier input node;
a second feedback resistor coupled between the second amplifier output node and the second amplifier input node;
wherein each of the first and second feedback resistors is implemented as a switched capacitor circuit which emulates a resistor; and
an additional fully differential amplifier circuit comprising a third amplifier input node coupled to the first resistor, a fourth amplifier input node coupled to the second resistor, a third amplifier output node driving a control terminal of the first transistor and a fourth amplifier output node driving a control terminal of the second transistor.

2. The circuit of claim 1, further comprising:
a first feedback capacitor coupled between the first amplifier output node and the first amplifier input node; and
a second feedback capacitor coupled between the second amplifier output node and the second amplifier input node.

3. The circuit of claim 2:
wherein the first feedback capacitor is connected in parallel with the switched capacitor circuit forming the first feedback resistor; and
wherein the second feedback capacitor is connected in parallel with the switched capacitor circuit forming the second feedback resistor.

4. The circuit of claim 1, further comprising:
a first chopping circuit at the first and second amplifier input nodes of the fully differential amplifier circuit; and
a second chopping circuit at the first and second amplifier output nodes of the fully differential amplifier circuit.

5. The circuit of claim 1, further comprising:
a first resistor coupled in series with the first transistor at the first amplifier input node;
a second resistor coupled in series with the second transistor at the second amplifier input node;
wherein the first and second resistors are further coupled to ground.

6. The circuit of claim 1, further comprising a common mode sensing circuit configured to sense a common mode voltage between the first and second transistors and control a common mode operation of the additional fully differential amplifier circuit.

7. The circuit of claim 1, further comprising a current sensing resistor coupled between the first and second input nodes.

8. The circuit of claim 7, wherein the current sensing resistor, the first input resistor and the second input resistor are matched resistors having substantially identical temperature coefficients.

9. The circuit of claim 8, wherein the current sensing resistor, the first input resistor and the second input resistor are each comprised of polysilicon resistors.

10. The circuit of claim 9, wherein the polysilicon resistors for the current sensing resistor, the first input resistor and the second input resistor all have a same length.

11. The circuit of claim 9, wherein the polysilicon resistors for the current sensing resistor, the first input resistor and the second input resistor are doped with an N-type dopant at a same dopant concentration.

12. The circuit of claim 9, wherein the polysilicon resistors for the current sensing resistor, the first input resistor and the second input resistor are integrated adjacent to each other.

13. The circuit of claim 9, wherein the polysilicon resistors for the current sensing resistor are integrated in a first circuit area and wherein the polysilicon resistors for the first input resistor and the second input resistor are integrated in a second circuit area next to said first circuit area.

14. The circuit of claim 9, wherein the polysilicon resistors for the current sensing resistor are integrated in a first circuit area and wherein the polysilicon resistors for the first input resistor and the second input resistor are integrated in a second circuit area positioned on one side of the first circuit area and a third circuit area positioned on another side of the first circuit area opposite said one side.

15. A circuit, comprising:
a differential input comprising a first input node and a second input node;
a first differential amplifier circuit comprising a first amplifier input node, a second amplifier input node and an amplifier output node;
a first input resistor coupled between the first input node and the first amplifier input node;
a second input resistor coupled between the second input node and the second amplifier input node;
a first sensing resistor coupled between the first amplifier input node and a ground node; and
a second sensing resistor coupled between the second amplifier input node and the ground reference node;
wherein each of the first and second sensing resistors is implemented as a switched capacitor circuit which emulates a resistor.

16. The circuit of claim 15, further comprising:
a first capacitor coupled between the first amplifier input node and the reference node; and
a second capacitor coupled between the second amplifier output node and the reference node.

17. The circuit of claim 15, further comprising:
a first transistor coupled between the first amplifier input node and the first input resistor;
a second transistor coupled between the second amplifier input node and the first input resistor; and
a second differential amplifier circuit comprising a first amplifier input node coupled to the first resistor, a second amplifier input node coupled to the second resistor, a first amplifier output node driving a control terminal of the first transistor and a second amplifier output node driving a control terminal of the second transistor.

18. The circuit of claim 17, further comprising a common mode sensing circuit configured to sense a common mode voltage between the first and second transistors and control a common mode operation of the additional fully differential amplifier circuit.

19. The circuit of claim 17, further comprising:
a first chopping circuit at the first and second input nodes; and
a second chopping circuit at the first and second amplifier input nodes of the first differential amplifier circuit.

20. A circuit, comprising:
a first input node;
a second input node;

a first output node;
a second output node;
a current sensing resistor connected between the first and second input nodes and through which a current to be sensed flows;
a first input resistor connected between the first input node and a first intermediate node;
a second input resistor connected between the second input node and a second intermediate node;
a first transistor coupled in series with the first input resistor between the first input node and the first amplifier input node;
a second transistor coupled in series with the second input resistor between the second input node and the second amplifier input node;
a fully differential amplifier circuit comprising a first amplifier input node coupled to the first intermediate node, a second amplifier input node coupled to the second intermediate node, a first amplifier output node coupled to the first output node and a second amplifier output node coupled to the second output node;
a first feedback resistor connected between the first output node and the first intermediate node;
a second feedback resistor connected between the second output node and the second intermediate node;
wherein each of the first and second feedback resistors is implemented as a switched capacitor circuit which emulates a resistor; and
an additional fully differential amplifier circuit comprising a third amplifier input node coupled to the first resistor, a fourth amplifier input node coupled to the second resistor, a third amplifier output node driving a control terminal of the first transistor and a fourth amplifier output node driving a control terminal of the second transistor.

21. The circuit of claim 20, further comprising:
a first chopping circuit having inputs connected to the first and second intermediate nodes and outputs connected to the first and second amplifier input nodes; and
a second chopping circuit having inputs connected to the first and second amplifier output nodes and outputs connected to the first and second output nodes.

22. The circuit of claim 20, further comprising:
a first feedback capacitor connected between the first output node and the first intermediate node; and
a second feedback capacitor connected between the second output node and the second intermediate node.

23. The circuit of claim 20, wherein the current sensing resistor, the first input resistor and the second input resistor are matched resistors having substantially identical temperature coefficients.

24. The circuit of claim 23, wherein the current sensing resistor, the first input resistor and the second input resistor are each comprised of polysilicon resistors having a same length.

25. The circuit of claim 24, wherein the polysilicon resistors for the current sensing resistor are integrated in a first circuit area and wherein the polysilicon resistors for the first input resistor and the second input resistor are integrated in a second circuit area adjacent said first circuit area.

26. The circuit of claim 20, further comprising:
a first resistor coupled in series with the first transistor at the first amplifier input node;
a second resistor coupled in series with the second transistor at the second amplifier input node;
wherein the first and second resistors are further coupled to ground.

27. The circuit of claim 20, further comprising a common mode sensing circuit configured to sense a common mode voltage between the first and second transistors and control a common mode operation of the additional fully differential amplifier circuit.

28. A circuit, comprising:
a first input node;
a second input node;
an output node;
a current sensing resistor connected between the first and second input nodes and through which a current to be sensed flows;
a first input resistor connected between the first input node and a first intermediate node;
a second input resistor connected between the second input node and a second intermediate node;
a differential amplifier circuit comprising a first amplifier input node coupled to the first intermediate node, a second amplifier input node coupled to the second intermediate node, and an amplifier output node coupled to the first output node;
a first sensing resistor connected between the first amplifier input node and a ground node; and
a second sensing resistor connected between the second amplifier input node and the ground node;
wherein each of the first and second sensing resistors is implemented as a switched capacitor circuit which emulates a resistor.

29. The circuit of claim 28, further comprising:
a first capacitor connected in parallel with the first resistor; and
a second capacitor connected in parallel with the second resistor.

30. The circuit of claim 28, wherein the current sensing resistor, the first resistor and the second resistor are matched resistors having substantially identical temperature coefficients.

31. The circuit of claim 30, wherein the current sensing resistor, the first input resistor and the second input resistor are each comprised of polysilicon resistors having a same length.

32. The circuit of claim 31, wherein the polysilicon resistors for the current sensing resistor are integrated in a first circuit area and wherein the polysilicon resistors for the first input resistor and the second input resistor are integrated in a second circuit area adjacent said first circuit area.

33. The circuit of claim 28, further comprising:
a first transistor coupled between the first amplifier input node and the first intermediate node;
a second transistor coupled between the second amplifier input node and the first intermediate node;
a fully differential amplifier circuit comprising a first amplifier input node coupled to the first intermediate node, a second amplifier input node coupled to the second intermediate node, a first amplifier output node driving a control terminal of the first transistor and a second amplifier output node driving a control terminal of the second transistor.

34. The circuit of claim 33, further comprising a common mode sensing circuit configured to sense a common mode voltage between the first and second transistors and control a common mode operation of the additional fully differential amplifier circuit.

35. The circuit of claim 28, further comprising:
a first chopping circuit having inputs connected to the first and second input nodes and output connected to the first and second intermediate nodes; and a second chopping circuit having inputs coupled to the first and second intermediate nodes and outputs connected to the first and second amplifier input nodes of the differential amplifier circuit.

\* \* \* \* \*